United States Patent
Jungerman et al.

(10) Patent No.: US 6,701,269 B1
(45) Date of Patent: Mar. 2, 2004

(54) JITTER MEASUREMENT EXTRAPOLATION AND CALIBRATION FOR BIT ERROR RATIO DETECTION

(75) Inventors: Roger L. Jungerman, Petaluma, CA (US); Lovell H. Camnitz, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/352,716

(22) Filed: Jan. 28, 2003

(51) Int. Cl.[7] .............................................. G01R 29/02
(52) U.S. Cl. ...................................................... 702/106
(58) Field of Search ........................ 702/106; 382/100; 713/176, 179, 463; 380/54, 252, 210, 51

(56) References Cited

U.S. PATENT DOCUMENTS 6,185,509 B1   2/2001  Wilstrup et al.
6,463,109 B1  10/2002  McCormack et al.
2003/0219143 A1 * 11/2003  Moskowitz et al. ........ 382/100

FOREIGN PATENT DOCUMENTS

WO    WO 99/39216    8/1999

* cited by examiner

*Primary Examiner*—John Barlow
*Assistant Examiner*—Tung Lau

(57) ABSTRACT

Error-related information acquired using a bit error ratio detector (BERT) is extrapolated on the basis of prior testing, in which measurements "superior" to those acquired by the BERT are used to provide an initial extrapolation calibration. For example, measures of data dependent jitter acquired by a digital communications analyzer (DCA) may be used to offset the less accurate jitter-related measures by the BERT. As a consequence, the benefits of a DCA and a BERT are combined, while using only the BERT.

19 Claims, 5 Drawing Sheets

JITTER MEASUREMENT EXTRAPOLATION AND CALIBRATION FOR BIT ERROR RATIO DETECTION

TECHNICAL FIELD

The invention relates generally to jitter analysis within a signal and more particularly to determining jitter characteristics of a device, wherein a "device" is broadly defined to include multi-component systems.

BACKGROUND ART

As the speeds of communications systems increase, the adverse effects of jitter on the performance of such a system also increase. The term "jitter" is defined herein as deviation of the significant instants of a signal from their ideal position in time. Thus, jitter within a clock signal or within a data signal will cause phase variations from the ideal. As examples, the "significant instants" of a data signal may be the rising and falling edges of data bits or the "significant instants" of a clock signal may be the rising edge of each pulse or may be the center of each clock pulse.

Jitter is one of the major causes of errors within a communications system. Jitter may be divided into a number of different categories. "Deterministic jitter" (DJ) is defined as the category of jitter that is predictable and constant. Deterministic jitter has specific sources. "Random jitter" (RJ) is defined as the category of jitter that will vary from measurement to measurement. Random jitter adds in a root sum of square (RSS) basis. One source of random jitter is thermal noise in electrical components. Random jitter is typically assumed to have a Gaussian distribution. As is know in the art, a Gaussian random variable will exceed fourteen times its standard deviation (i.e., 14×S.D.) only one time in $10^{12}$. As a consequence, if exceeding this span causes a bit error in a communications system, the system has a bit error rate of $10^{-12}$. "Data dependent jitter" (DDJ) is defined herein as jitter that will vary in accordance with the pattern of data within a data signal.

The characterization of a digital communications system may be performed using two separate measurement devices, namely a bit error ratio tester (BERT) and a digital communications analyzer (DCA). The BERT is an error performance analyzer, while the DCA is a sampling oscilloscope. The DCA is utilized to generate eye mask measurements. This may be a 30 second test in which the sampling rate is 40 kHz, which corresponds to more than one million samples. The eye mask test detects distortions that include overshoot, rise time, and jitter. The DCA is superior to the BERT with respect to measuring DDJ, since the DCA has a frequency response that more closely approaches the ideal Thompson-Bessel response. A DCA adds less distortion to the measurement of a device under test than does the BERT. However, while the DCA can acquire parametric measurements that are in some aspects more accurate than the BERT, the DCA operates at a lower sampling rate, so that test times are significantly longer.

A BERT error detector has decision circuits that operate at a high bit rate. Every bit in a sequence is measured, but the BERT returns only a binary result (i.e., either the bit is "correct" or it is "in error"). In comparison, the DCA samples the bit stream at a relatively low rate (e.g., 40 kHz), but the amplitude of the signal is measured to 10 bits, for example. In some standards, jitter is tested by measuring the bit error ratio as a function of sampling time. The graphing of such measurements provides what is referred to as the "bathtub jitter curve," on the basis of the shape of the curve. By mapping the measurements of the bit error rate versus sampling point delay, jitter can be equated from the bathtub curve and viewed as a histogram.

The BERT measurements at a speed of three Gb/second to an error rate of $10^{-12}$ may take approximately five minutes. In order to decrease the time necessary to test a number of devices, the BER performance at the vertical edges of the "eye" may be extrapolated (Q measurement). In an application published under the Patent Cooperation Treaty (WO 99/39216), Wilstrup et al. describe a method of using a time interval analyzer to extrapolate jitter measurements. The described method includes obtaining measurements of the spans of a signal from a device under test, generating variation measurements for each of the spans, transforming the variation estimates from a time domain to a frequency domain, and determining the random component and the deterministic component of the jitter. As with other extrapolation approaches, the assumption of a Gaussian distribution of total jitter is required, but the efforts to group all jitter components for an extrapolation lead to inaccurate predictions in some applications.

As is known in the art, finite bandwidth in the jitter measurement devices causes degradation of the eye opening. This adds pattern dependent jitter and results in a slowing of the transition times in the eye. The DCA suffers from the bandwidth limitation much less than the BERT. Another cause of the closing of the eye in time is the fact that jitter is inherent to the measurement device. U.S. Pat. No. 6,185, 509 to Wilstrup et al. addresses this second concern by using a time interval analysis approach to reducing the effects of inherent measurement jitter. However, the issue of finite frequency response is not addressed. Thus, while advancements in jitter analysis are being made, further improvements are possible.

SUMMARY OF THE INVENTION

Extrapolation of bit error ratio-related information acquired using a bit error ratio tester (BERT) is enabled by "calibrating" the extrapolation process. The extrapolation initialization involves utilizing at least one measurement of jitter that is superior to the corresponding measurement available via the BERT. A digital communications analyzer (DCA) may be used to obtain the measurement or measurements considered to be superior to those acquired via the BERT.

As one possible implementation, the DCA is connected to a device under test and is configured to maximize its accuracy with regard to measuring deterministic jitter (DJ). A "device under test" is defined broadly herein as including multi-component systems, such as a digital communications system. A reliable measure of DJ of a transceiver under test may be acquired by utilizing a quadrature time base and pattern trigger. The quadrature timebase provides very low random jitter (RJ) in the measurement, unlike typical DCA measurements. The worst-case data transitions are identified. The "worst-case" data transitions in a testing signal from the device under test are bit transition pairs (rising and falling edges) that yield the most closed "eye" in the mid-range decision point voltage. Analysis of eye diagrams is known in the art.

The BERT is one that has error location capability. Consequently, the worst-case data transitions identified by the DCA can be remeasured via the BERT, with the remeasuring of the worst-case data transitions being performed as a function of sampling time down to a first error rate. For example, the first error rate may be $10^{-8}$.

In "correcting" the BERT data, the data dependent jitter (DDJ) measurement by the DCA may be considered to be correct, since it is superior to the DDJ measurement capability of the BERT. With this assumption, the bit error ratio data of individual pattern transitions are offset in time. The offset may be by the difference of the DDJ measurements on the BERT and on the DCA, but other approaches may be used. With the corrected bit error ratio data, the BERT bathtub jitter curve (bit error ratio as a function of sampling point delay) for the device under test is calculated. DJ and RJ are evaluated from this bathtub jitter curve and the data is extrapolated to a second error rate (for example, $10^{-12}$) that is lower than the first error rate. Subsequent extrapolations of BERT-acquired data may be performed using the same offset in time, so that the use of the DCA is not necessary, particularly if the type of device under test and the test pattern (for example, a stress pattern of finite length) remain the same.

In another implementation, the BERT is used to first identify the worst-case data transitions, with the DCA being used to acquire measurements regarding the worst-case data transitions identified by the BERT. For these worst-case data transitions, bathtub jitter curves are generated for both the BERT-acquired data and the DCA-acquired data. Within a reasonable period of time, the DCA is unable to measure as low a bit error ratio value as the BERT. However, the DCA has a lower internal jitter and a wider bandwidth, which results in a narrower "jitter region" at the edge of the eye diagram. The two bathtub jitter curves are used to extrapolate the DCA measurements down to a low error rate value, such as $10^{-12}$. The extrapolation procedure is then applied to "calibrate" measurements on subsequent tested devices, using only the BERT to acquire the measurements.

An advantage of the described implementations (in which bit error ratio-related information is acquired from both the DCA and the BERT in the initial extrapolation) is that subsequent uses of the BERT will provide the parametric accuracy of the DCA, without impacting measurement speed of the device analysis.

DETAILED DESCRIPTION

Figure 1:
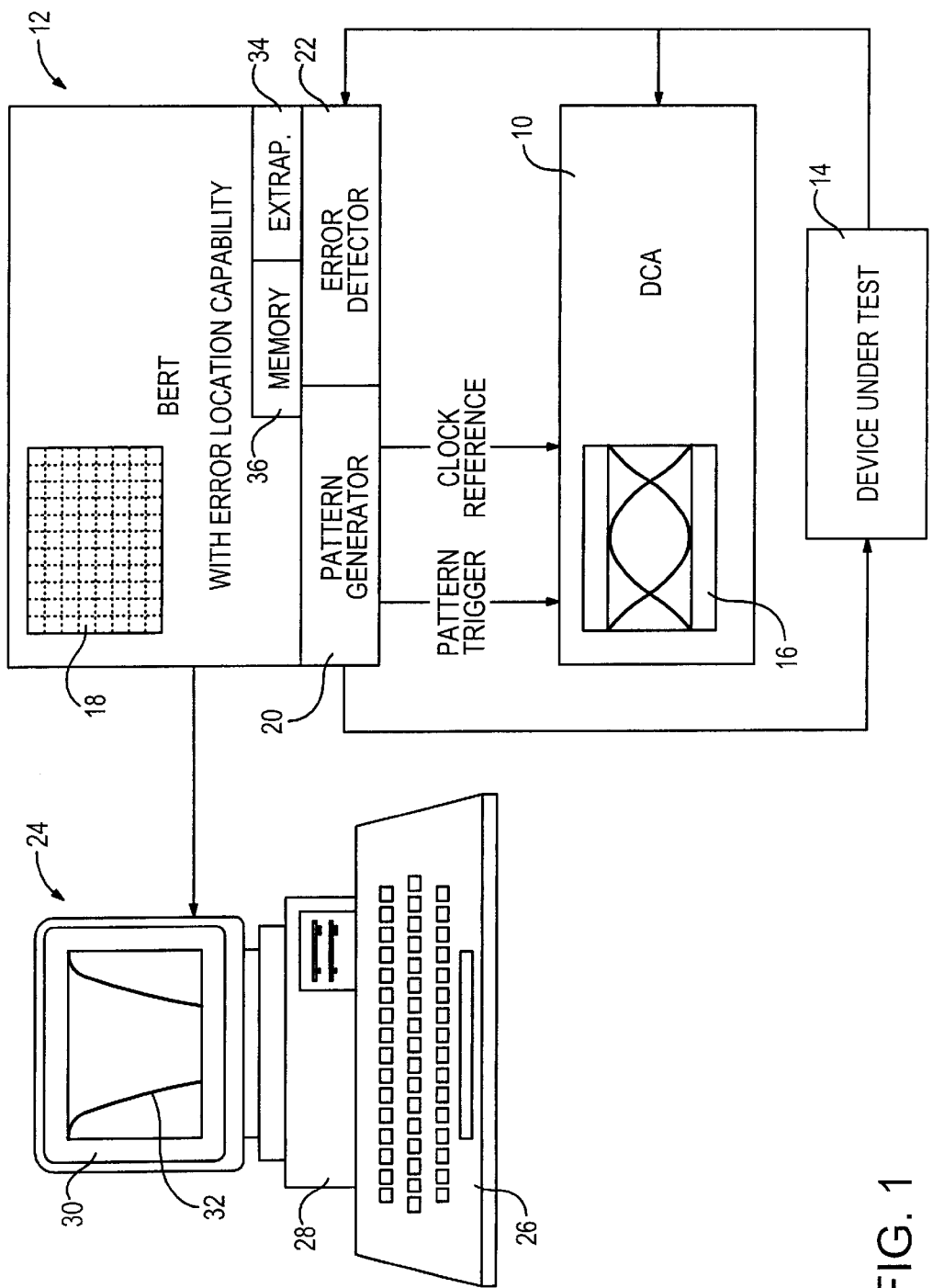
FIG. 1 is a schematic view of components for implementing an extrapolation procedure in accordance with the present invention.

With reference to FIG. 1, a digital communications analyzer (DCA) 10 and an error performance analyzer, bit error ratio tester (BERT) 12 are shown as being connected to a device under test (DUT) 14. As is known in the art, the DCA may be used to generate eye mask measurements and the BERT may be used to perform long tests of the bit error ratio (BER). The display screen 16 of the DCA 10 is shown as having an eye diagram. An eye mask measurement requires approximately thirty seconds of testing. The DCA may have a 40 kHz sampling rate that corresponds to over one million samples in the thirty second time span. The mask test may be used to detect distortions such as overshoot, rise time, and jitter. The BERT 12 measures every bit in the sequence, but returns only a binary result (i.e., the bit is "correct" or the bit is "in error"). On the other hand, the DCA samples the bit stream at the relatively low rate, but measures the amplitude of the signal to approximately 10 bits. Moreover, timebase settings allow the DCA to have internal jitter that is much less than the internal jitter of the BERT.

The BERT 12 has error location capability. Moreover, in addition to a display screen 18, the BERT includes a pattern generator 20 and an error detector 22. However, the pattern generator may be a separate component, such as the pattern generator sold by Agilent Technologies, Inc. under the product number 81133A. The BERT is shown as being connected to a work station 24 having a keyboard 26, a computer 28, and a monitor 30. The workstation may be used to complement the abilities of the BERT by automating the tedious task of moving the sampling point and computing and plotting BER results. Thus, the monitor 30 shows a bathtub jitter curve 32 for the DUT 14. However, the present invention may be implemented without the use of a separate workstation, if the BERT 12 includes extrapolation capability 34 and cooperative memory 36.

Figure 2:
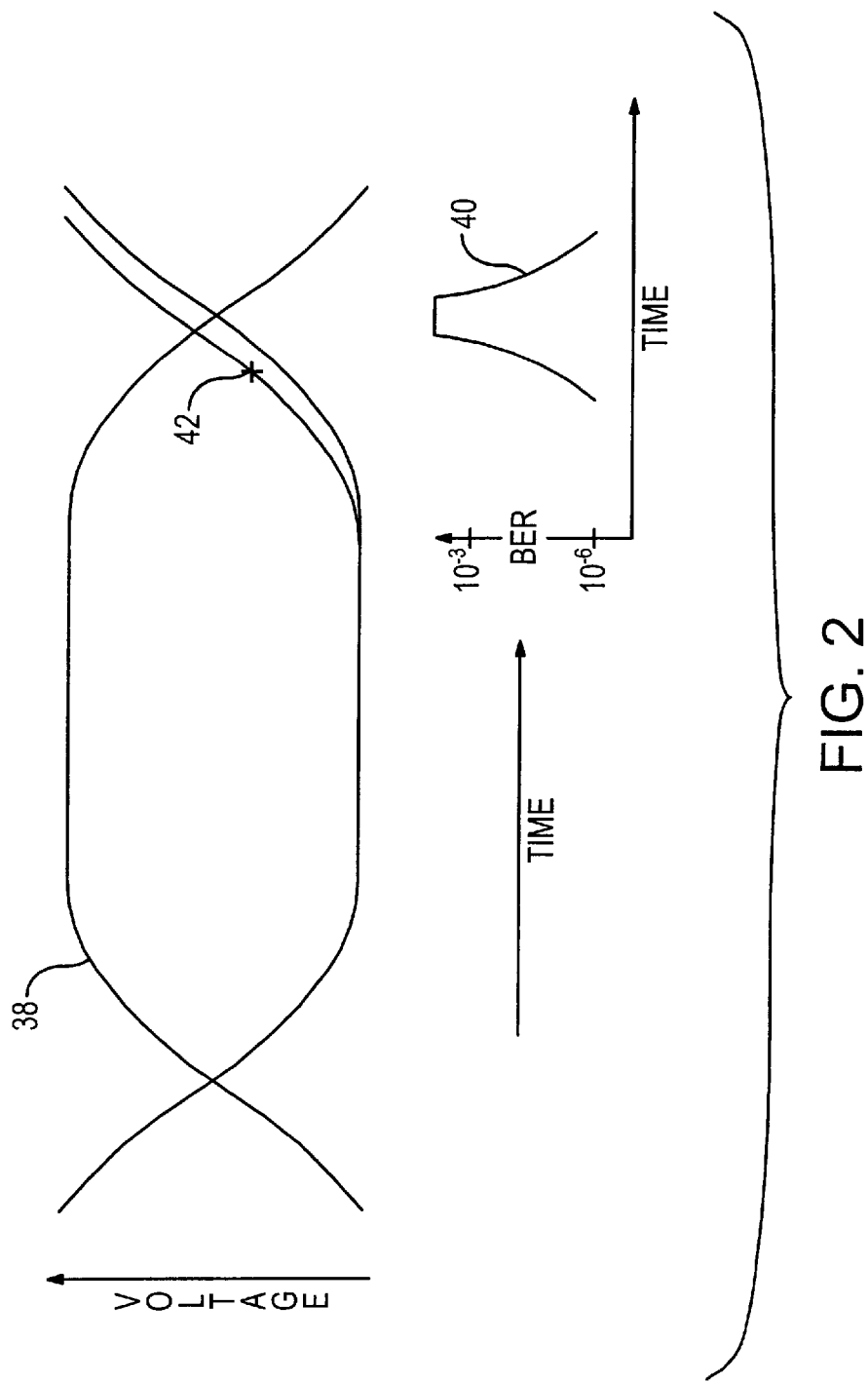
FIG. 2 is an illustration of data plots relevant to the components of FIG. 1.

FIG. 2 schematically shows the sampling operations. The pattern generator 20 of FIG. 1 is used to introduce a test pattern at the DUT 14. Typically, the test pattern is a standardized pattern, such as a stress pattern with a few hundred or thousand bits pattern length. The DUT may be a transceiver having an optical output that is monitored by the BERT 12 and the DCA 10. For applications in which the BERT does not include an optical receiver, an external optical receiver can be used, with the electrical output of the receiver being connected to the input of the BERT. In FIG. 2, the eye mask pattern 38 is shown as being measures of voltage as a function of time. The portion of the eye mask pattern shown in FIG. 2 may be representative of the worst-case data transitions in the sequence. The worst-case data transitions are the bit transition pair (rising and falling edges) that provides the most closed eye in the mid-range decision point voltage. The graph 40 of BER as a function of time is acquired by varying the sampling point 42.

Figure 3:
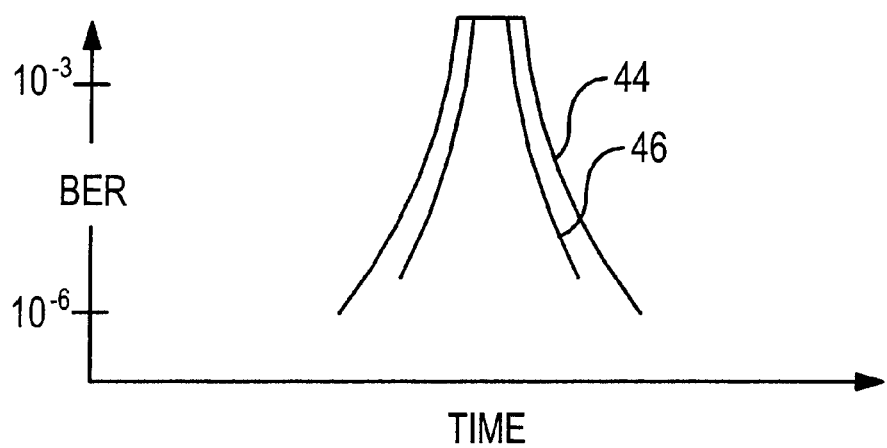
FIG. 3 is a graph of bit error ratio as a function of sampling time.

In FIG. 3, plot 44 represents the BER versus time as acquired by the BERT 12, while plot 46 represents BER as a function of time as acquired by the DCA 10. The DCA is unable to measure to as low a BER value in a reasonable period of time. However, the DCA has lower internal jitter and has a wider bandwidth than the BERT. As a consequence, the DCA has a narrower "jitter region" at the edge of the eye, where BER is large. Ideally, the invention combines the advantages of the DCA with the advantages of the BERT, so as to provide measurements with the parametric accuracy of the DCA without impacting measurement speed.

Figure 4:
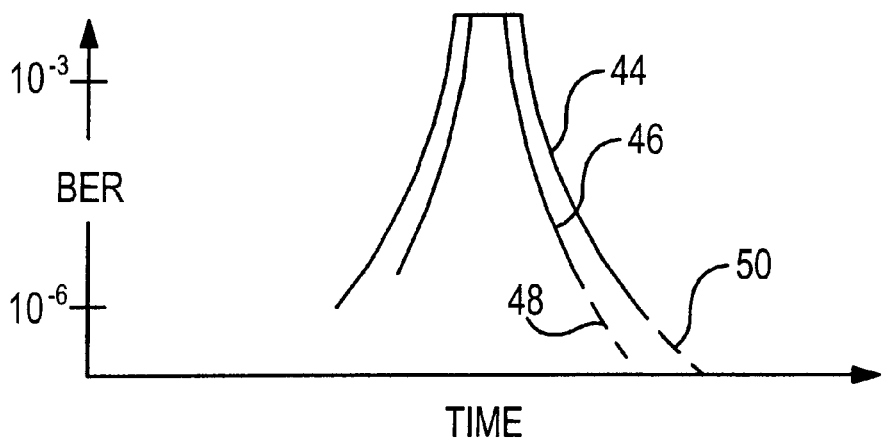
FIG. 4 is a graph of FIG. 3, but with extrapolated data.

FIG. 4 represents extrapolations that occur in accordance with a second embodiment of the invention, as will be described below. The extrapolations utilize Gaussian fits to provide extrapolation values (represented by dashed line 48) for the DCA plot 46 and to provide extrapolation values (represented by the dashed line 50) for the BERT plot 44. The extrapolation parameters are stored for subsequent evaluations of devices under test. As previously stated, the devices under test may be digital communications systems or the like. Using the extrapolation process of the present invention allows the extrapolation parameters to be used in subsequent evaluations of devices of the same type, since the initial test can be used for "calibration."

Figure 5:
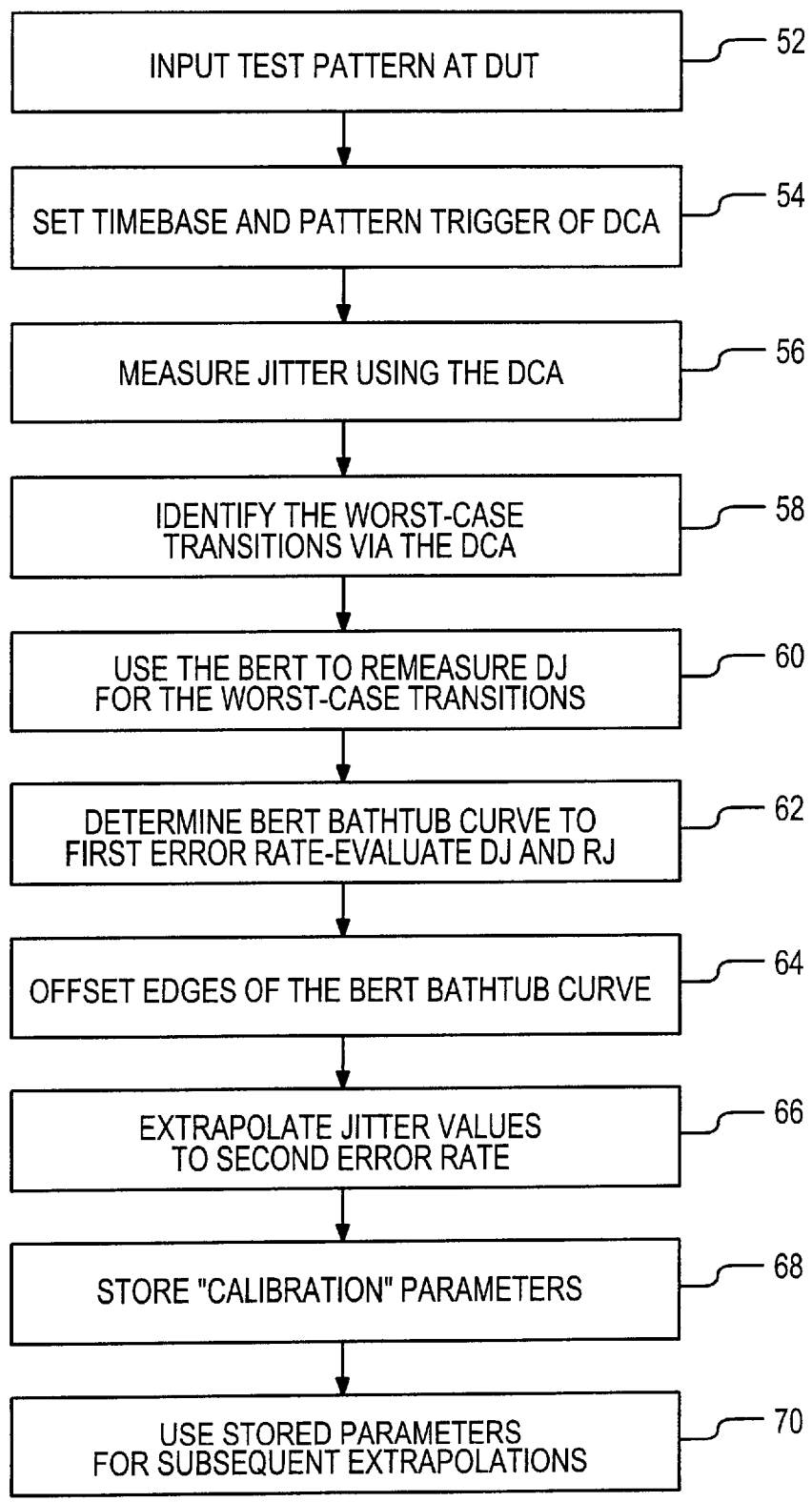
FIG. 5 is a process flow of steps for carrying out the invention in accordance with a first embodiment.

A first implementation of the extrapolation process will be described with reference to FIGS. 1 and 5. The BERT 12 has a sampling rate significantly higher than that of the DCA 10, so that the BERT is better equipped to evaluate random jitter (RJ) and deterministic jitter (DJ) more rapidly and accurately than the DCA. The BERT uses a histogram of BER versus sampling point delay (i.e., the BERT bathtub jitter curve) with many sampling points. From this histogram, the DJ can be extracted from the total jitter.

At step 52, a test pattern is input to the DUT 14. As previously noted, the test pattern may be a stress pattern with a pattern length of a few hundred or a thousand bits. Unlike the implementation to be described with reference to FIG. 6, the process of FIG. 5 uses the DCA 10 to provide the initial measurements. At step 54, the timebase and pattern trigger of the DCA are set. A quadrature timebase establishes a desired operational condition for the DCA. As shown in FIG. 1, the DCA receives the pattern trigger and clock reference from the pattern generator 20 of the BERT 12. The clock reference provides a low RJ in the measurements, unlike typical DCA measurements. Using a calibrated optical frequency response, the DCA provides an accurate measurement of the DJ of a transceiver for the selected pattern trigger position in the test pattern sequence.

With the quadrature timebase and pattern trigger properly set and with the calibrated optical frequency response, the DCA 10 is used to measure jitter characteristics (step 56) and to identify the worst-case transitions (step 58). Information regarding the locations of the worst-case data transitions is passed to the BERT 12.

The method may be employed for testing either electrical devices or optical devices, such as optical transceivers. In optical applications in which an external optical receiver is used, the combined response of the optical receiver and the BERT electrical front-end may be uncalibrated. For both the electrical and optical applications, the DJ of the worst-case data transitions identified by the DCA is remeasured via the BERT, using the error location capability of the BERT (as indicated at step 60). Then, in step 62, the BERT bathtub jitter curve is measured down to a first error rate. As one possibility, the first error rate may be $10^{-8}$. The DJ and the RJ are then evaluated from the BERT bathtub curve.

Since the DCA 10 is best equipped to determine data dependent jitter (DDJ), it can be assumed that the measure of DDJ by the DCA is accurate. From this assumption, the edges of the BERT bathtub jitter curve are offset, as represented by step 64 in FIG. 5. As one possibility, the edges of the BERT bathtub jitter curve are offset by the difference of the DDJ measured on the BERT and the DDJ measured on the DCA for the worstcase DCA data transitions. Based upon the offset bathtub jitter curve, the data is extrapolated to a second error rate (step 66). The second error rate may be $10^{-12}$ BER. The extrapolated data is reliable, since it is determined using accurate values of DDJ, DJ, and RJ.

The combination of the measurements of the DCA 10 and the BERT 12 "calibrates" the BERT with regard to subsequent measurements. The process avoids the requirement of designing a precisely calibrated BERT front-end and/or optics. In FIG. 5, the "calibration" parameters are stored at step 68 for subsequent extrapolations (step 70).

Figure 6:
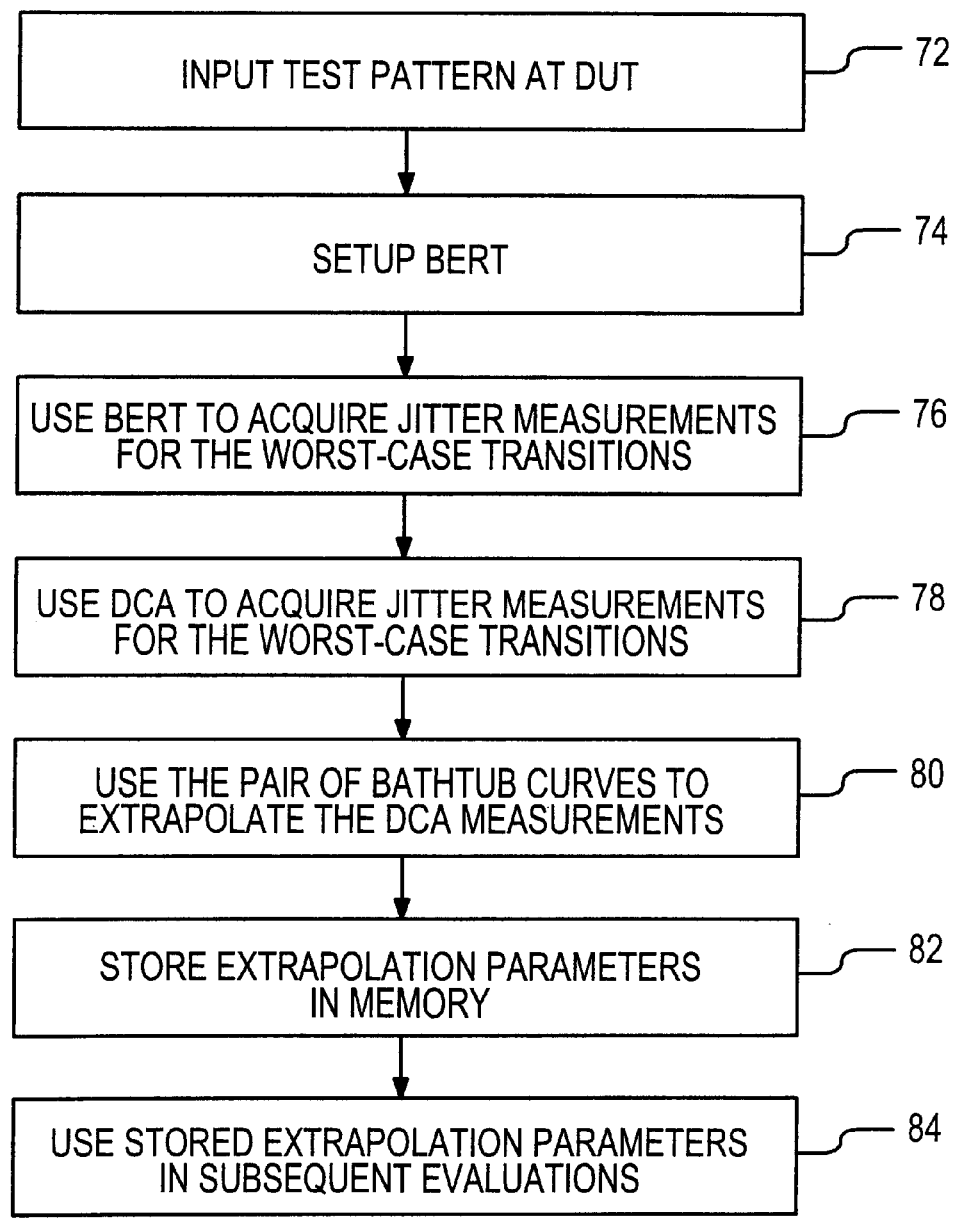
FIG. 6 is a process flow of steps for carrying out the invention in accordance with a second embodiment.

The second implementation will now be described with reference to FIG. 6. At step 72, a test pattern is input at the device under test 14. Again, a stress pattern having a finite length may be used. In step 74, the settings of the. BERT 12 are established. Thus, a decision point of the BERT may be set at the mid-point of the eye in voltage (an Auto Align 0–1 threshold) and may be offset in time to achieve a given initial error rate, such as $10^{-2}$.

The BERT error analysis is used to measure the worst-case transition in the sequence from the DUT 14, as indicated at step 76. The sampling point is moved through the eye to measure the BER versus sampling point for the worst-case data transition.

Next, a similar measurement is performed via the DCA 10 (step 78). Initially, a number of bits are measured with random triggering in order to detect the eye opening and the jittered region at the edge of the eye. Then, a pattern trigger is used to measure only the transition that the BERT determined to be the worst-case data transition. To perform this, the system is calibrated for the cabling delays between the BERT and the DCA. It is verified that on the DCA the eye opening is limited by the worst-case transition as measured on the BERT. In most cases, this cannot be entirely guaranteed. Since the BERT may have significantly less bandwidth than the DCA, the bandwidth-induced pattern dependent jitter may result in different worst-case transitions on the BERT and the DCA. Different transitions are measured on the DCA until the correct worst-case transition is identified. For the same worse-case transition measured on the DCA, the bathtub jitter curves are determined for the BERT and the DCA.

As a result of steps 76 and 78, plots 44 and 46 of FIG. 3 may be acquired. Then the extrapolation for determining the extrapolation lines 48 and 50 of FIG. 4 may be performed. The original plots are used to extrapolate the DCA measurements down to a low error rate value, such as $10^{-12}$, as indicated at step 80 of FIG. 6. The extrapolation parameters are stored in memory (step 82) for use in subsequent evaluations of devices under test (step 84). The tests of the other devices may be performed using the BERT 12, without using a DCA 10, since the extrapolation parameters will apply to the subsequent evaluations.

The measurements by the BERT 12 and the DCA 10 are performed on the same device under test and with the same pattern at several different bit error ratio values. Since only the worst-case pattern is used, pattern dependent jitter is disregarded in the process. The BERT and DCA bathtub jitter curves can be assumed Gaussian and a curve fit (as represented by extrapolation lines 48 and 50 in FIG. 4) may be performed on both curves in order to determine the extrapolated shape. The shapes of FIG. 4 identify the jitter for both curves and show a relatively fixed offset in time that is due to timebase nonlinearities and bandwidth limitations in the BERT.

As one example of calculations for extrapolation down to $10^{-12}$ BER levels using BERT data that is acquired down to $10^{-6}$ for the worst-case transition, the following procedure may be used to achieve measurement fidelity that would result from use of a DCA, but that is achieved using the BERT as the sole transfer standard:

We express:
  tDCA(BER,jitterDCAandDUT) fit to DCA curve of BER vs. time (line 48 in FIG. 4)
and
  tBERT(BER,jitterBERTandDUT) fit to BERT curve of BER vs. time (line 50 in FIG. 4).
Calculate BERT-DCA jitter (RSS):
  jitterBERT:=N
  $\sqrt{\text{jitterBERTandDUT}^2 - \text{jitterDCAandDUT}^2}$
Then, recalculate the BERT curve, removing the BERT jitter:
  tBERT(BER,jitterDCAandDUT), with the assumption that DCA jitter is minimal.

At the minimum BER level measured for the DCA (e.g., $10^{-3}$):

toffset:=tBERT( $10^{31}$ $^3$,jitterDCAandDUT)−tDCA($10^{-3}$, jitterDCAandDUT) this offset is due to timebase non-linearities and bandwidth limited rise/fall times.

Now, the BERT curve can be extrapolated from the minimum BER value measured (e.g., $10^{-6}$). We extrapolate in this case down to $10^{-12}$:

tDCA($10^{-12}$,jitterDCAandDUT):=tBERT($10^{-6}$, jitterDCAandDUT)−toffset assuming deterministic time offsets due to pattern dependent effects are independent of the error rate.

Similarly, on a dew DUTx we can apply the corrections using only BERT measurements. Measure DUTx at several BER values using the BERT on the selected pattern transition and fit the curve to determine the Gaussian form by:

(1) Calculating the DUTx jitter from:

jitterDUT:=$\sqrt{\text{jitterBERTandDUTx}^2 - \text{jitterBERT}^2}$ jitterBERT from prior calibration, and (2) Extrapolating as if it were measured on the DCA:

tDCA($10^{-12}$,jitterDut):=tBERT($10^{-6}$,jitterDUT)−toffset where toffset is taken from the prior determination.

Other extrapolation calculations may be substituted without diverging from the invention, which enables "post-calibration" testing to occur using only the BERT, while maintaining the accuracy available when another measuring device (e.g., a DCA) is used with the BERT.

What is claimed is:

1. A method of enabling extrapolation of bit error ratio (BER) related information comprising:
    providing a testing signal for which there are measures of a plurality of components of jitter, including measures indicative of data dependent jitter (DDJ) and at least one of deterministic jitter (DJ) and random jitter (RJ);
    using a BER tester to acquire BER information that is specific to said testing signal as extended to a first error rate;
    extrapolating said BER information acquired by using said BER tester to a second error rate, including using said measures of said components of jitter as a basis for determining calibrations for said extrapolating; and
    employing said calibrations for subsequent extrapolations of BER-related information acquired via said BER tester.

2. The method of claim 1 wherein said testing signal is an output of a device under test (DUT), said subsequent extrapolations being performed after corresponding steps of connecting said BER tester to devices of a same type as said DUT and acquiring BER information specific to said devices.

3. The method of claim 1 wherein said measures that are indicative of DJ and DDJ are acquired via a digital communications analyzer (DCA).

4. The method of claim 2 further comprising operating each of said BER tester and said DCA to generate a plot of BER as a function of sampling point delay (i.e., bathtub jitter curve) for a DUT from which said testing signal is generated.

5. The method of claim 4 further comprising identifying worst-case data transitions of said testing signal on a basis of said plot generated by said DCA, said extrapolating of said BER information acquired by said BER tester including offsetting individual data transitions in said BER information by the difference in time of DDJ measurements acquired by said BER tester and by said DCA for said worst-case data transitions.

6. The method of claim 5 wherein said offsetting provides offset BER information, said extrapolating further including using said offset BER information to calculate an adjusted bathtub jitter curve and evaluating said RJ and said DJ on the basis of said adjusted bathtub curve, said extrapolating to said second error rate being dependent upon said evaluating.

7. The method of claim 3 wherein said measures that are indicative of DJ and DDJ are acquired with said DCA having a quadrature timebase and a calibrated frequency response.

8. The method of claim 1 wherein said extrapolating is an extrapolation to a second error rate of approximately $10^{-12}$.

9. The method of claim 1 wherein said testing signal is a repeating fixed length test pattern that is output from a device under test for evaluation of said device under test.

10. A method of enabling extrapolation of error-related information comprising:
    utilizing a repeating bit pattern in an operation of a device under test (DUT);
    using both a digital communications analyzer (DCA) and a bit error ratio detector (BERT) to determine information regarding said repeating bit pattern received from said DUT, including generating a DCA calculation of bit error ratio as a function of sampling time via said DCA and including generating a BERT calculation of said bit error ratio as a function of sampling time via said BERT;
    adjusting said BERT calculations on a basis of predetermined superiority of said DCA to said BERT with respect to acquiring first jitter-specific measurements used in generating said bit error ratio as a function of sampling time, thereby providing adjusted BERT calculations;
    re-evaluating second jitter-specific measurements on the basis of said adjusted BERT calculations, said BERT being superior to said DCA with respect to acquiring said second jitter-specific measurements; and
    extrapolating said information regarding said repeating bit pattern received from said DUT on a basis of said adjusting and re-evaluating.

11. The method of claim 10 wherein said extrapolating includes determining a bit error rate to a level below the level measured in generating said BERT calculations.

12. The method of claim 10 wherein said first jitter-specific measurements include data dependent jitter (DDJ) measurements and wherein said second jitter-specific measurements include measurements of deterministic jitter (DJ) and random jitter (RJ).

13. The method of claim 10 further comprising:
    determining a calibration function for determining said adjusted BERT calculations in order to enable said re-evaluating and extrapolating; and
    recording said calibration function, thereby enabling subsequent re-evaluations and extrapolations when said BERT is coupled to DUTs without the use of said DCA.

14. The method of claim 10 wherein said DCA and BERT calculations are generated for worst-case transitions in said repeating bit pattern.

15. A system for providing bit error ratio (BER) related information comprising:
    a digital communications analyzer (DCA) having a DCA input for connection to a device under test (DUT), said DCA being configured to generate data indicative of data dependent jitter (DDJ) and at least one other jitter-related measurement; and
    a BER tester having a tester input for connection to said DUT, said BER tester being configured to acquire BER information relating to said DUT, said acquired BER information extending to a first error rate, wherein said BER tester is operatively associated with a processor and memory, said processor being enabled to determine an extrapolation function for extrapolating said BER information to a second error rate on a basis of said data generated by said DCA, said memory having storage of said extrapolation function and variables of said extrapolation function such that subsequent extrapolations of subsequently acquired BER information are enabled without access to data generated by said DCA.

16. The system of claim 15 wherein said DCA has a calibrated optical frequency response and is operated with a quadrature timebase.

17. The system of claim 16 wherein said BER tester has an uncalibrated optical front end.

18. The system of claim 15 wherein each of said DCA and said BER tester is configured to generate a bathtub curve of BER versus sampling time for worst-case transitions of a signal received from said DUT.

19. The system of claim 18 wherein said processor is configured to adjust said bathtub curve generated by said BER tester on the basis of said data from said DCA and to set said variables of said extrapolation function in accordance with adjustments to said bathtub curve generated by said BER tester.

* * * * *